United States Patent
Tan et al.

(10) Patent No.: US 12,525,530 B2
(45) Date of Patent: Jan. 13, 2026

(54) TECHNIQUES TO MANUFACTURE INTER-LAYER VIAS

(71) Applicant: Micron Technology, Inc., Boise, ID (US)

(72) Inventors: Jun Rong Tan, Singapore (SG); Keen Wah Chow, Singapore (SG); Hao Ting Teo, Singapore (SG); Hoong Shing Wong, Singapore (SG)

(73) Assignee: Micron Technology, Inc., Boise, ID (US)

( * ) Notice: Subject to any disclaimer, the term of this patent is extended or adjusted under 35 U.S.C. 154(b) by 635 days.

(21) Appl. No.: 17/929,973

(22) Filed: Sep. 6, 2022

(65) Prior Publication Data

US 2024/0079317 A1  Mar. 7, 2024

(51) Int. Cl.
*H01L 23/522* (2006.01)
*H01L 21/768* (2006.01)

(52) U.S. Cl.
CPC .... *H01L 23/5226* (2013.01); *H01L 21/76802* (2013.01); *H01L 21/76877* (2013.01)

(58) Field of Classification Search
CPC ........... H01L 23/5226; H01L 21/76802; H01L 21/76877; H01L 21/76897; H01L 23/53295; H10B 80/00; H10B 12/30
See application file for complete search history.

(56) References Cited

U.S. PATENT DOCUMENTS

| | | | | |
|---|---|---|---|---|
| 9,224,640 B2* | 12/2015 | Burke | ............... | H01L 21/76847 |
| 10,090,258 B1* | 10/2018 | Boyd | ................ | H01L 21/76843 |
| 2019/0259698 A1* | 8/2019 | Takahashi | .............. | H10B 41/27 |
| 2022/0278083 A1* | 9/2022 | Chang | ................... | H01L 25/105 |

* cited by examiner

*Primary Examiner* — Karen Kusumakar
(74) *Attorney, Agent, or Firm* — Holland & Hart LLP

(57) ABSTRACT

Methods, systems, and devices for techniques to manufacture inter-layer vias are described. In some examples, a manufacturing process for a via to one or more metal lines within an integrated circuit may not include forming a metal pad for the via. For example, the manufacturing process may include forming a layer of dielectric material over a set of metal lines. The manufacturing process may further include forming a cavity through the dielectric layer (e.g., using an etching procedure), exposing the upper surfaces and sidewalls of one or more metal lines of the set. Subsequently, the via may be formed by depositing a conductive material within the cavity. In some cases, the conductive material may be deposited to contact the sidewalls of the one or more metal lines. Such an assembly may establish electrical connection to other electrical components of the integrated circuit.

17 Claims, 6 Drawing Sheets

TECHNIQUES TO MANUFACTURE INTER-LAYER VIAS

FIELD OF TECHNOLOGY

The following relates to one or more systems for memory, including techniques to manufacture inter-layer vias.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source.

DETAILED DESCRIPTION

Some integrated circuits, such as integrated circuits included in memory devices, may include an assembly of one or more layers of metal lines coupling various components of the integrated circuit, such as within a page buffer or a complimentary metal-oxide semiconductor (CMOS). In some cases, different layers of metal lines may be accessed using vias running vertically through the assembly. Some memory manufacturing operations may include forming a metal pad coupled with one or more metal lines of the assembly, and subsequently forming a via which lands on the metal pad. However, forming the metal pad may include steps which cause defects in an integrated circuit. These defects may include under-etch or missing-etch, which may occur when the metal pad fails to make a connection with the metal lines; broken pad-lines, which may occur when the metal pad breaks into multiple metal lines, causing unwanted electrical connections, and dents, which may occur when the metal pad causes unwanted deformities in one or more adjacent metal lines. These defects may cause the integrated circuit to be unusable, which may decrease the total yield of the manufacturing process. Accordingly, techniques to improve via manufacturing are desired.

As described herein, a manufacturing process for a via to one or more metal lines within an integrated circuit may not include forming a metal pad for the via. For example, the manufacturing process may include forming a layer of dielectric material over a set of metal lines. The manufacturing process may further include forming a cavity through the dielectric layer (e.g., using an etching procedure), exposing the upper surfaces and sidewalls of one or more metal lines of the set. Subsequently, the via may be formed by depositing a conductive material within the cavity. In some cases, the conductive material may be deposited to contact the sidewalls of the one or more metal lines. Such an assembly may establish electrical connection to other electrical components of the memory device, which may reduce the quantity of steps used (e.g., compared with a manufacturing process which includes forming a metal pad in the assembly), and thus may reduce potential defects in manufacturing integrated circuits. Although the techniques described herein are used in the context of a memory system (e.g., as part of a DRAM memory device), one skilled in the art may appreciate that such techniques may be used in other electronic systems, such as semiconductor devices which include one or more levels of circuitry, other types of memory system (e.g., magnetic hard disks, RAM, ROM, dynamic RAM, SDRAM, SRAM, FeRAM, MRAM, RRAM, flash memory, PCM, self-selecting memory, chalcogenide memory technologies, NOR, or NAND memory devices), or both.

Figure 1:
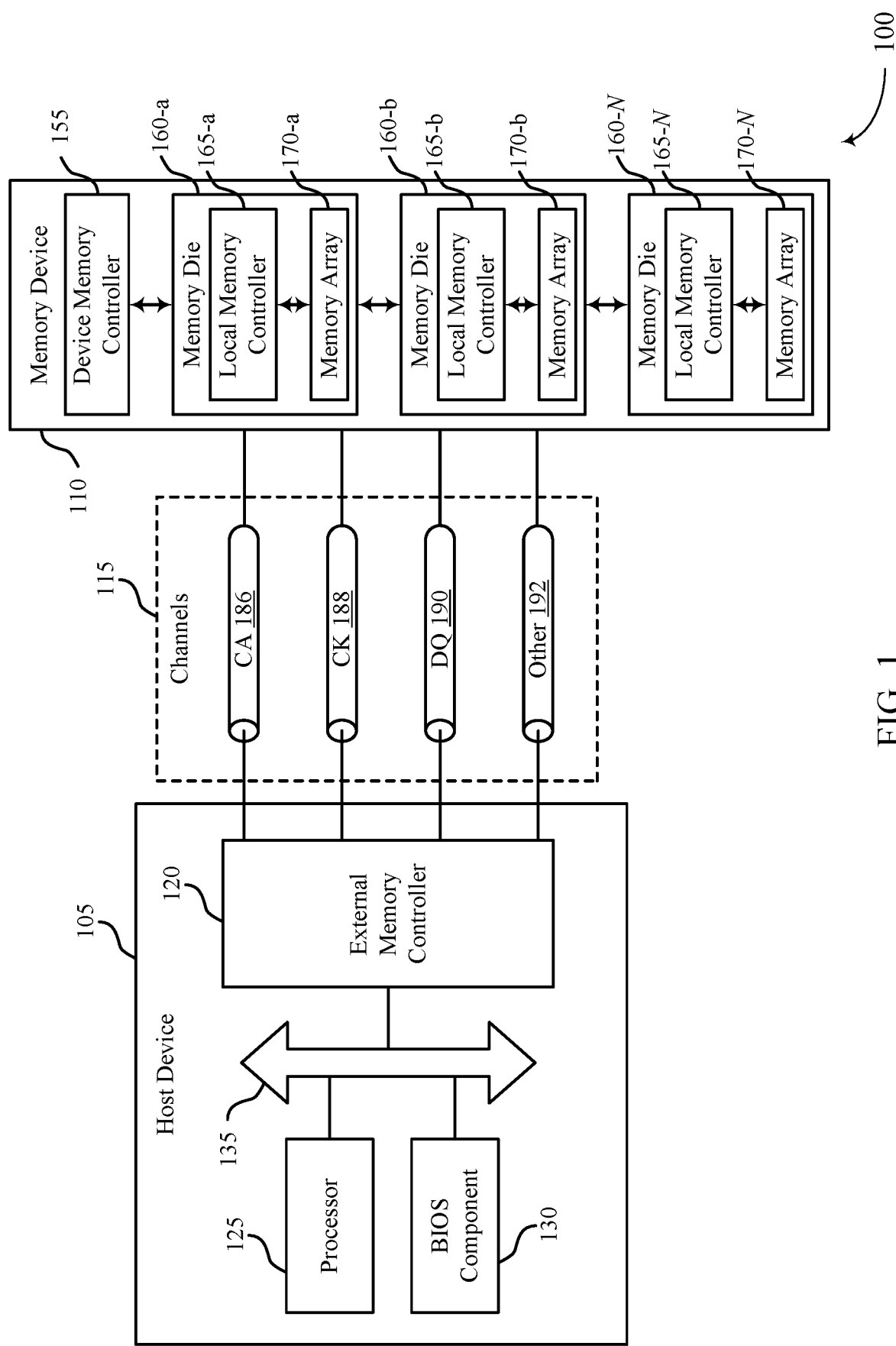
FIG. 1 illustrates an example of a system that supports techniques to manufacture inter-layer vias in accordance with examples as disclosed herein.
Figure 2:
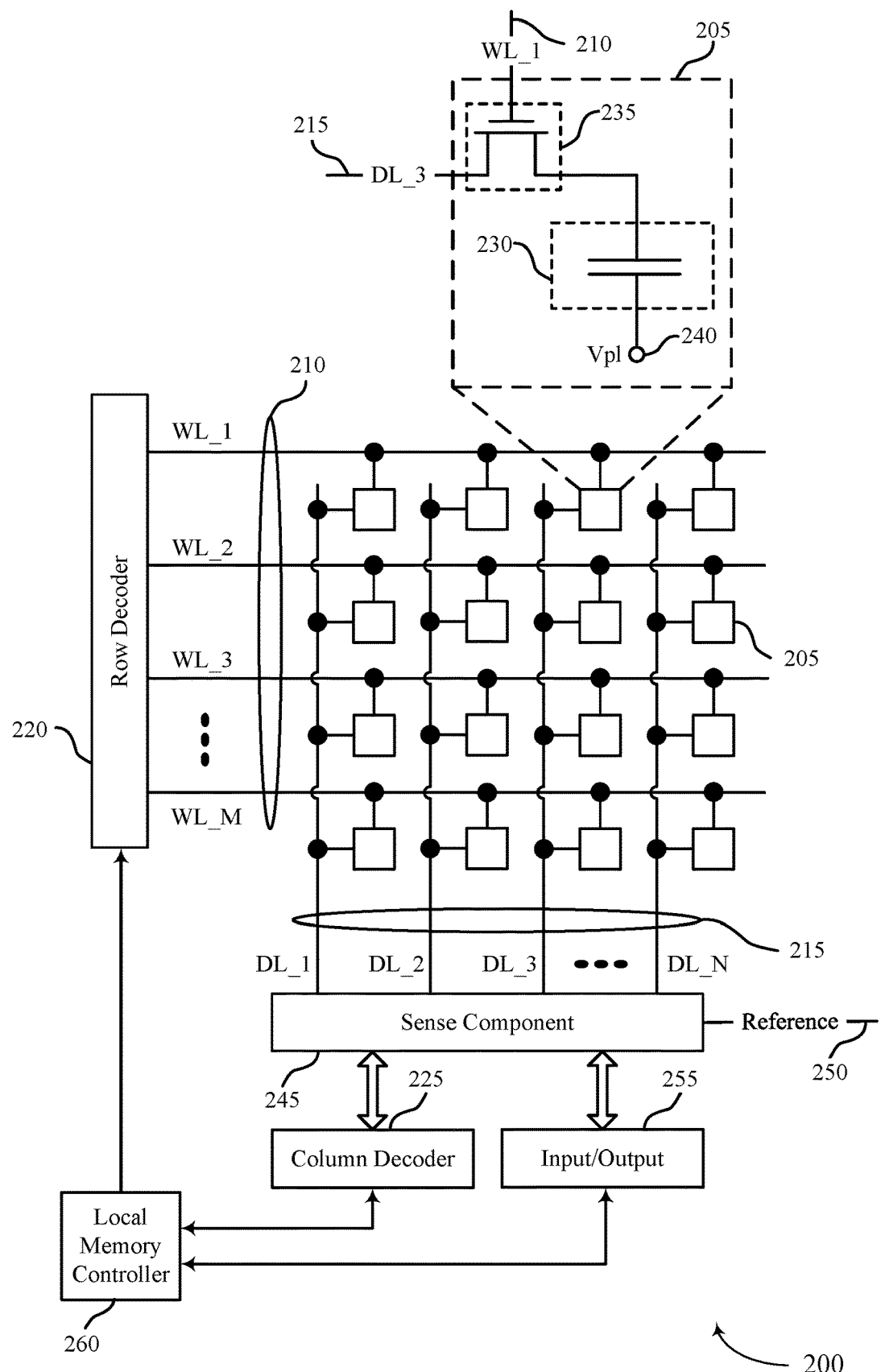
FIG. 2 illustrates an example of a memory die that supports techniques to manufacture inter-layer vias in accordance with examples as disclosed herein.

Features of the disclosure are initially described in the context of systems and dies with reference to FIGS. 1 and 2. Features of the disclosure are described in the context of assemblies as described with reference to FIGS. 3A through 4. These and other features of the disclosure are further illustrated by and described with reference to a flowchart that relate to techniques to manufacture inter-layer vias as described with reference to FIG. 5.

FIG. 1 illustrates an example of a system 100 that supports techniques to manufacture inter-layer vias in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or any combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type device to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or any combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include hardware, firmware, or instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or any combination thereof.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105.

Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or any combination thereof.

In some examples, a manufacturing process for a via to one or more metal lines within an integrated circuit, such as an integrated circuit included in a host device 105 or a memory device 110, may not include forming a metal pad for the via. For example, the manufacturing process may include forming a layer of dielectric material over a set of metal lines. The manufacturing process may further include forming a cavity through the dielectric layer (e.g., using an etching procedure), exposing the upper surfaces and sidewalls of one or more metal lines of the set. Subsequently, the via may be formed by depositing a conductive material within the cavity. In some cases, the conductive material may be deposited to contact the sidewalls of the one or more metal lines. Such an assembly may establish electrical connection to other electrical components of the integrated circuit, which may reduce the quantity of steps used (e.g., compared with a manufacturing process which includes forming a metal pad in the assembly), and thus may reduce potential defects in manufacturing integrated circuits. Although the techniques described herein are used in the context of a memory system (e.g., as part of a DRAM memory device), one skilled in the art may appreciate that such techniques may be used in other electronic systems, such as semiconductor devices which include one or more levels of circuitry, other types of memory system (e.g., magnetic hard disks, RAM, ROM, dynamic RAM, SDRAM, SRAM, FeRAM, MRAM, RRAM, flash memory, PCM, self-selecting memory, chalcogenide memory technologies, NOR, or NAND memory devices), or both.

FIG. 2 illustrates an example of a memory die 200 that supports techniques to manufacture inter-layer vias in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a charge representative of the programmable states in a capacitor. DRAM architectures may include a capacitor that includes a dielectric material to store a charge representative of the programmable state. In other memory architectures, other storage devices and components are possible. The memory cell 205 may include a logic storage component, such as capacitor 230, and a switching component 235 (e.g., a cell selection component). The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include access lines (e.g., word lines 210, digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. Memory cells 205 may be positioned at intersections of the word lines 210 and the digit lines 215.

Operations such as reading and writing may be performed on the memory cells 205 by activating access lines such as a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in a two-dimensional or in a three-dimensional configuration may be referred to as an address of a memory cell 205. Activating a word line 210 or a digit line 215 may include applying a voltage to the respective line.

Accessing the memory cells 205 may be controlled through a row decoder 220, or a column decoder 225, or any combination thereof. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device (e.g., a memory device 110) that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 260 may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

In some examples, the memory die 200 may include one or more layers of metal lines coupling various components of the memory die 200, such as within a page buffer of the memory die 200 or as part of a complimentary metal-oxide semiconductor (CMOS) of the memory die 200. Different layers of metal lines may be accessed using vias running vertically through the assembly. In some examples, the distance between adjacent metal lines (e.g., the pitch of the metal lines) may be near or approximately the resolution used for photolithographic processes to form the metal lines.

In some examples, manufacturing process for a via to one or more metal lines within the memory die 200 may not include forming a metal pad for the via. For example, the manufacturing process may include forming a layer of dielectric material over a set of metal lines. The manufacturing process may further include forming a cavity through the dielectric layer (e.g., using an etching procedure), exposing the upper surfaces and sidewalls of one or more metal lines of the set. Subsequently, the via may be formed by depositing a conductive material within the cavity. In some cases, the conductive material may be deposited to contact the sidewalls of the one or more metal lines. Such an assembly may establish electrical connection to other electrical components of the memory die 200, which may reduce the quantity of steps used (e.g., compared with a manufacturing process which includes forming a metal pad in the assembly), and thus may reduce potential defects in manufacturing memory devices. Although the techniques described herein are used in the context of a memory system (e.g., as part of a DRAM memory device), one skilled in the art may appreciate that such techniques may be used in other electronic systems, such as semiconductor devices which include one or more levels of circuitry, other types of memory system (e.g., magnetic hard disks, RAM, ROM, dynamic RAM, SDRAM, SRAM, FeRAM, MRAM, RRAM, flash memory, PCM, self-selecting memory, chalcogenide memory technologies, NOR, or NAND memory devices), or both.

Figure 3A:
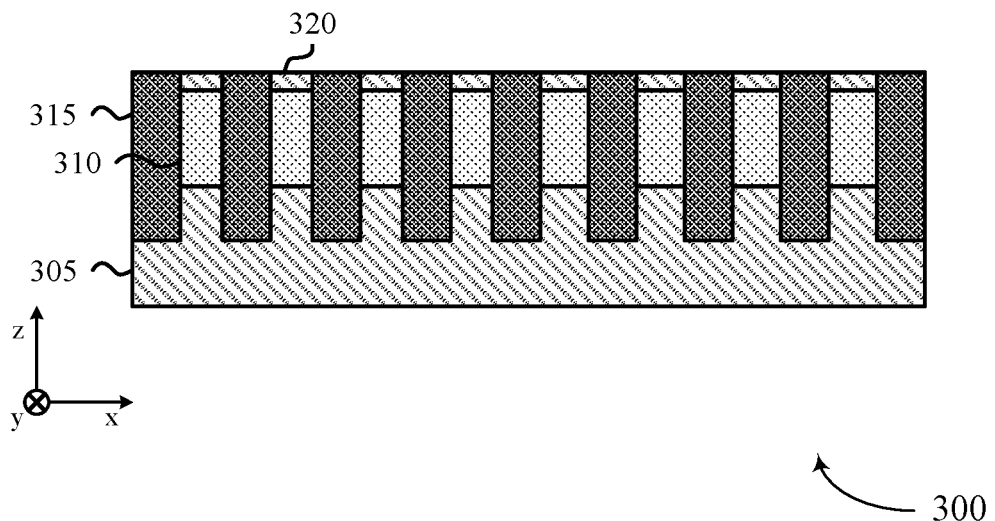
FIGS. 3A through 3C illustrates an example of stages of an assembly that supports techniques to manufacture inter-layer vias in accordance with examples as disclosed herein.
Figure 3B:
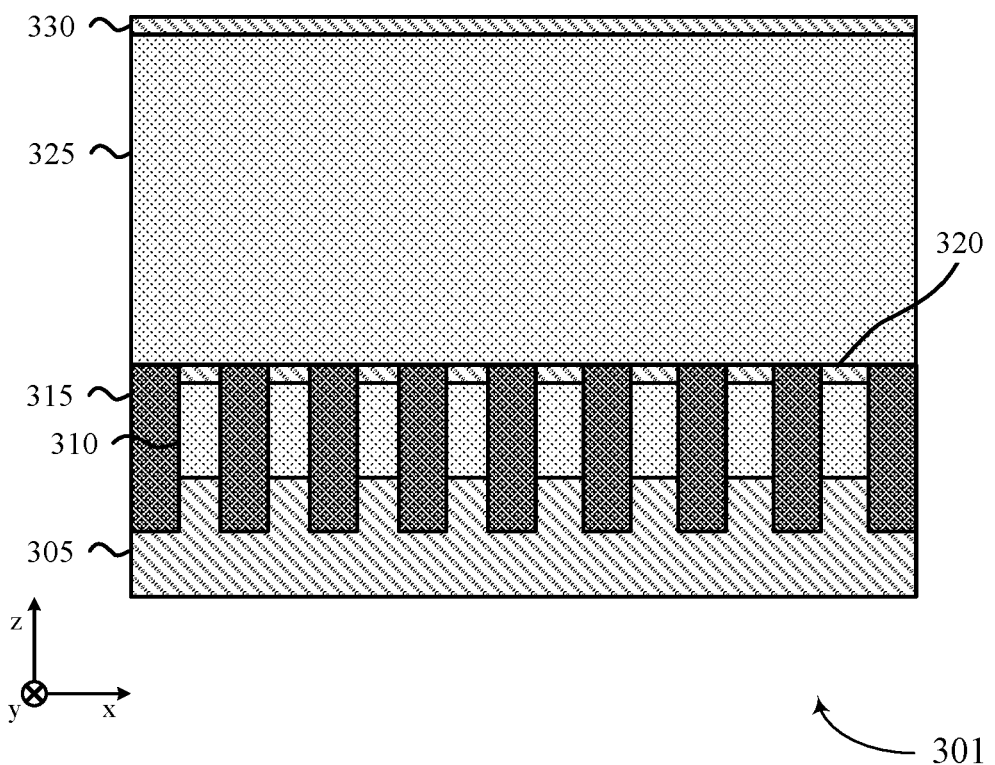
Figure 3C:
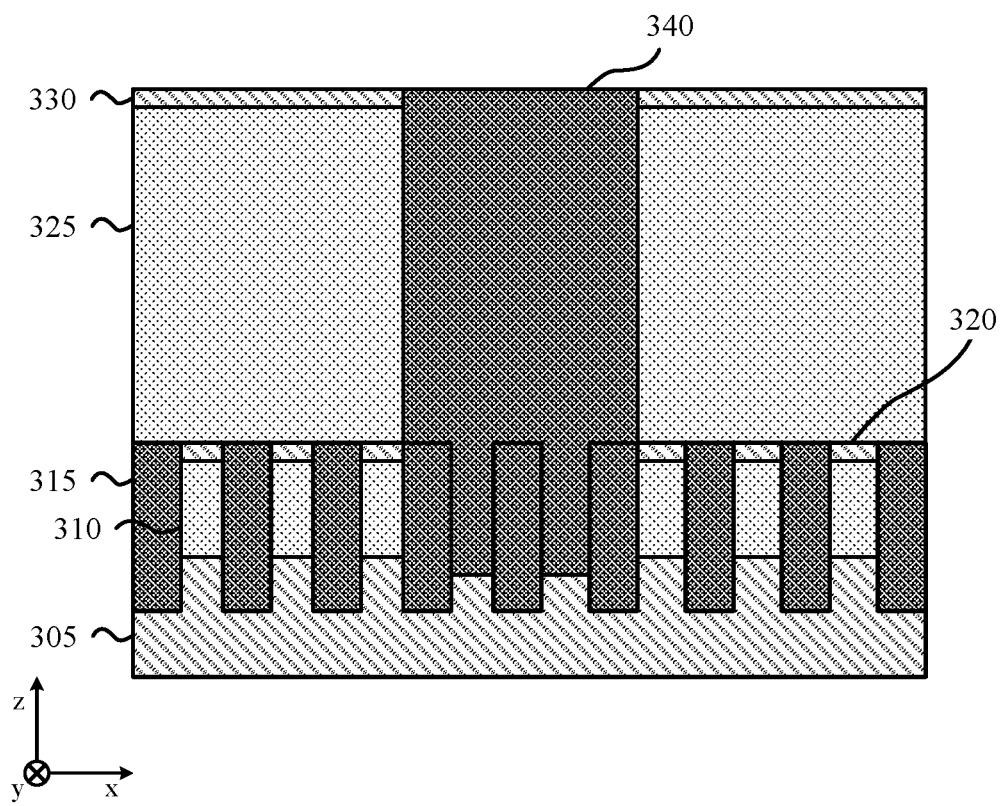

FIGS. 3A through 3C illustrate examples of operations that support techniques to manufacture inter-layer vias in accordance with examples disclosed herein. For example, FIGS. 3A through 3C may illustrate aspects of a sequence of operations for fabricating aspects of an integrated circuit, such as complementary metal-oxide semiconductor (CMOS) interconnects between layers of the integrated circuit. In some examples, the integrated circuit may be an example of or may be part of a memory device, such as a page buffer or other portions of a memory device. Each view of the figures may be described with reference to an x-direction, a y-direction, and a z-direction, as illustrated. The provided figures may include section views that illustrate example cross-sections (e.g., side views) of the memory device. Although the integrated circuit illustrates examples of certain relative dimensions and quantities of various features, aspects of the integrated circuit may be implemented with other relative dimensions or quantities of such features in accordance with examples as disclosed herein.

Some manufacturing operations for integrated circuit may include forming a via extending through one or more layers of the integrated circuit to couple one or more metal lines with various components of the integrated circuit (e.g., forming an interconnect via). To form the via, the manufacturing operations may include forming a metal pad coupled with one or more metal lines of the assembly, and subsequently forming the via to land on the metal pad. However, forming the metal pad may include steps which cause defects in the integrated circuit, such as under-etch or missing-etch, broken pad-lines, and dents. Further, the manufacturing operations may include multiple photolithography processes to form the pad, which may increase complexity and cost of the manufacturing operations. For example, the photolithography process to form the metal lines may be separate from the photolithography process used to form the pad. Because the pitch of the metal lines may be similar to the resolution of the photolithography process, using a separate photolithography process for the metal lines may maintain good photolithography properties for the metal lines.

Operations illustrated in and described with reference to FIGS. 3A through 3C may show examples of forming an interconnect via without forming a metal pad, and may be performed by a manufacturing system, such as a semiconductor fabrication system configured to perform additive operations such as deposition or bonding, subtractive operations such as etching, trenching, planarizing, or polishing, and supporting operations such as masking, patterning, photolithography, or aligning, among other operations that support the described techniques. In some examples, operations performed by such a manufacturing system may be supported by a process controller or its components as described herein.

FIG. 3A illustrates an example of an assembly 300 that supports techniques to manufacture inter-layer vias in accordance with examples as disclosed herein. The assembly 300 may include one or more layers of various dielectric materials, such as a layer 305 (e.g., a first layer) of a first dielectric material and a layer 310 (e.g., a second layer) of a second dielectric material above the layer 305. The assembly 300 may further include one or more metal lines 315 extending vertically (e.g., in the z-direction) through the layer 310 and at least partially through the layer 305. The one or more metal lines 315 may be arranged in a horizontal row extending in the x-direction, and each metal line 315 may extend in the y-direction (e.g., to couple with various components of the integrated circuit). In some examples, the assembly 300 may optionally include a layer 320 (e.g., a fourth layer) of a third dielectric material above the layer 310. In such examples, the metal lines 315 may also extend vertically through the layer 320 (or at least partially through the layer 320).

The first set of manufacturing operations may include forming the assembly 300. For example, the first set of manufacturing operations may include depositing the layer 305 and subsequently depositing the layer 310 above (e.g., in the z-direction) the layer 305. In some cases the first dielectric material of the layer 305 may be an example of a nitride, while the second dielectric material of the layer 310 may be an example of an oxide. In some examples, the first set of manufacturing operations may optionally include depositing the layer 320 above the layer 310. In some cases, the third dielectric material of the layer 320 may be an example of a nitride.

The first set of manufacturing operations may further include removing portions of the assembly 300 to form a set of trenches extending in the y-direction. For example, the first set of manufacturing operations may include etching (e.g., using a photolithography process) the layer 310 and the layer 305 to form the set of trenches. In some cases, the etching process may be selective to the dielectric materials of the layer 305 and the layer 310. For example, the etching process may remove the second dielectric material of the layer 310 faster than the first dielectric material of the layer 305 (e.g., the layer 305 may act as an etch-stop for the etching process). Accordingly, the set of trenches may extend through the layer 310, and at least partially through the layer 305, as illustrated in FIG. 3A.

After forming the set of trenches, the first set of manufacturing operations may include forming the metal lines 315, for example by depositing a conductive material, such as tungsten, to fill the set of trenches. In some examples, the first set of manufacturing operations may further include performing a planarization operation, such as a chemical mechanical planarization (CMP), to planarize the assembly 300 (e.g., to create a substantially flat horizontal surface).

FIG. 3B illustrates an example of an assembly 301 of an integrated circuit after a second set of manufacturing operations that support techniques to manufacture inter-layer vias in accordance with examples disclosed herein. The assembly 301 may include one or more layers of various dielectric materials, such as a layer 325 (e.g., a third layer) of a fourth dielectric material. In some cases, the assembly 301 may optionally include a layer 330 (e.g., a fourth layer) of a fifth dielectric material above the layer 325.

The second set of manufacturing operations may include forming the assembly 301. For example, the first set of manufacturing operations may include depositing the layer 325 above (e.g., in the z-direction) the assembly 300. In some cases, the fourth dielectric material of the layer 325 may be an example of an oxide, which may be a same oxide as the second dielectric material of the layer 310, or may be a different oxide. In some examples, the first set of manufacturing operations may optionally include depositing the layer 330 above the layer 325. In some cases, the fifth dielectric material of the layer 330 may be an example of a nitride, which may be a same nitride as the first dielectric material of the layer 305, or may be a different nitride.

FIG. 3C illustrates an example of an assembly 302 of an integrated circuit after a third set of manufacturing operations that support techniques to manufacture inter-layer vias in accordance with examples disclosed herein. The assembly 302 may include a via 340 extending vertically (e.g., in the z-direction) through the layer 325, the layer 310, and in some cases at least partially through the layer 305. In some example, (e.g., if the assembly 302 includes the layer 320, the layer 330, or both), the via 340 may optionally extend vertically through the layer 320, the layer 330, or both.

The third set of manufacturing operations may include forming the assembly 302. For example, the third set of manufacturing operations may include etching (e.g., using a photolithography process) the layer 325, the layer 310, and the layer 305 to form a cavity. In some examples (e.g., if the assembly 302 includes the layer 320, the layer 330, or both), the third set of manufacturing operations may include etching the layer 320, the layer 330 or both. In some cases, the etching process may be selective to the dielectric materials of the layer 310, and the layer 325. For example, the etching process may remove the second dielectric material of the layer 310 and the fourth dielectric material of the layer 325 faster than the first dielectric material of the layer 305 (e.g., the layer 305 may act as an etch-stop for the etching process). Accordingly, the cavity may extend through the layer 325 and the layer 310, and in some cases at least partially through the layer 305, as illustrated in FIG. 3C. Although in some cases the layer 320 may be a same dielectric material as the layer 305, the layer 320 may be thinner than the layer 305, and the time for the etch may be established to ensure complete etching of the layers 325, 320, and 310, while stopping while etching the layer 305.

Etching the cavity may expose portions of a subset of the metal lines 315. For example, the cavity may expose upper surfaces of the subset of metal lines 315, along with one or more sidewalls of the subset of metal lines 315. In some examples, the cavity may expose a single sidewall of a first metal line 315 of the subset, such as a metal line 315 on the outer edge of the subset. Additionally or alternatively, the cavity may expose multiple sidewalls of a second metal line 315 of the subset, such as a metal line 315 between the outer edges of the subset.

After forming the cavity, the third set of manufacturing operations may further include forming the via 340, for example by depositing a conductive material, such as tungsten, to fill the cavity. In some cases, the via 340 may be deposited to couple (e.g., electrically contact) with the exposed portions of the metal lines 315 of the subset. In some example, the subset of metal lines 315 may include a metal line 315 which may not be electrically coupled with other components of the integrated circuit. For example, the subset of metal lines 315 may include one or more dummy lines (e.g., lines that are not connected to other circuits). In some examples, the third set of manufacturing operations may further include performing a planarization operation, such as a CMP operation, to planarize the assembly 302 (e.g., to create a substantially flat horizontal surface).

Figure 4:
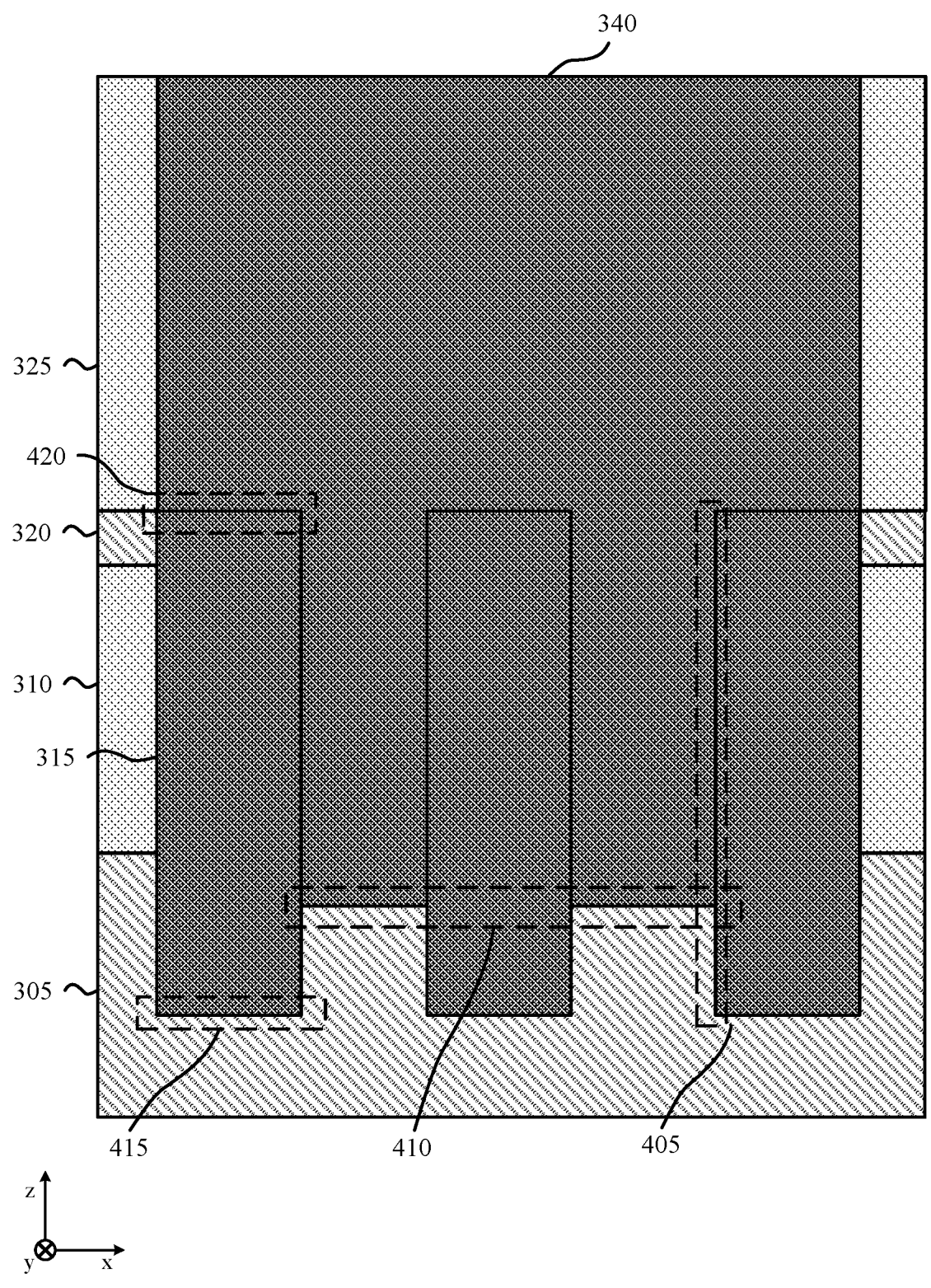
FIG. 4 illustrates an example of an assembly that supports techniques to manufacture inter-layer vias in accordance with examples as disclosed herein.

FIG. 4 illustrates an example of an assembly 400 that supports techniques to manufacture inter-layer vias in accordance with examples as disclosed herein. The assembly 400 may depict a portion of the assembly 302 (e.g., the assembly 400 may be an enlarged view of the assembly 302). The assembly 400 may include at least portions of elements of the assembly 302, such as the layer 305, the layer 310, the layer 320, the layer 325, the subset of metal lines 315, and the via 340.

The assembly 400 may illustrate geometrical aspects of the subset of metal lines 315 and the via 340. For example, each metal line 315 of the subset may include one or more sidewalls 405 in contact with the via 340, and each metal line 315 of the subset may include an upper surface 420 in contact with the via 340. Accordingly, the sidewalls 405 of the subset of metal lines 315 may be electrically coupled with the via 340. In some examples, one or more sidewalls 405 may be exposed (e.g., by the cavity as described with reference to FIG. 3C) prior to depositing the conductive material to form the via 340. In some cases, the via 340 may be electrically coupled (e.g., in direct electrical contact with) with multiple sidewalls 405 of the subset of metal lines 315. Because the via 340 may be formed after the set of metal lines 315, there may be grain boundary between the subset of metal lines 315 and the via 340 (e.g., at sidewalls 405).

In some examples, a bottom surface 410 of the via 340 may be positioned below (e.g., in the z-direction) the upper surfaces 420 of the subset of metal lines 315, and may be positioned above bottom surfaces 415 of the subset of metal lines 315 (e.g., the bottom surface 410 may be positioned between the bottom surface 415 and the upper surface 420 of the subset of metal lines). For example, because the etching of the cavity for via 340 may stop at (e.g., during etching of) the layer 305, the cavity for the via 340 may not go to the bottom of the metal lines 315. Accordingly, the subset of metal lines 315 may form "fingers" extending beyond the via 340. Alternatively, the bottom surface 410 of the via 340 may extend below the bottom surfaces 415 of the metal lines 315. For example, forming the cavity as described with reference to FIG. 3C may include a prolonged etching of the layer 305, such that a portion of the layer 305 below the set of metal lines 315 may be etched. Accordingly, the conductive material of the via 340 may be deposited such that the bottom surface 410 may be positioned below the bottom surfaces 415.

The upper surfaces 420 of the subset of metal lines 315 may be coupled (e.g., in direct electrical contact with) with the via 340. In some examples, the upper surface of the metal lines 315 may be positioned above the layer 310 and the layer 305. In some examples, one or more upper surfaces 420 may be exposed (e.g., by the cavity as described with reference to FIG. 3C) prior to depositing the conductive material to form the via 340. In some cases, after depositing the conductive material to form the via 340, the via 340 be in contact with the upper surfaces 420 of the subset of metal lines 315.

Figure 5:
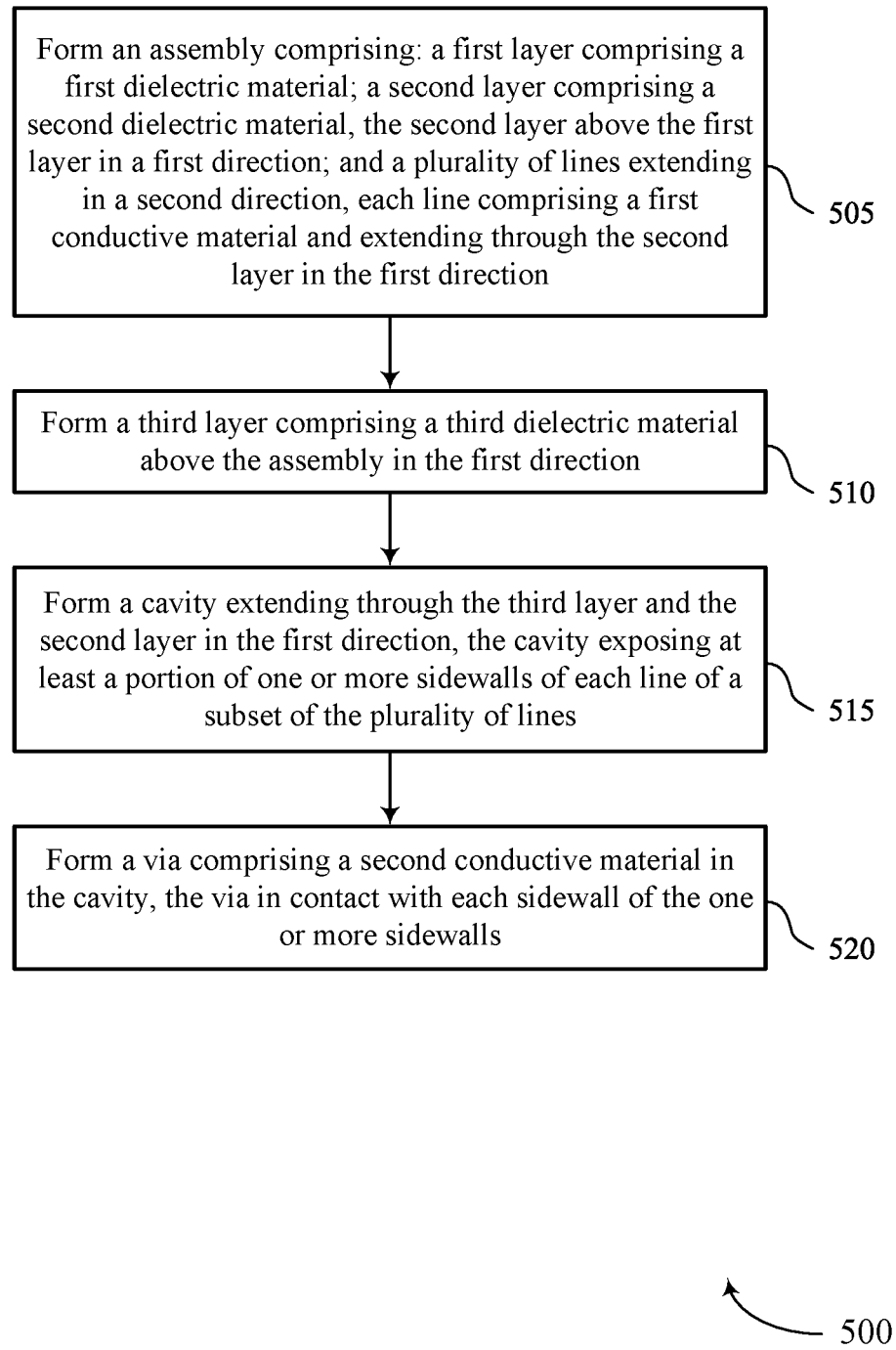
FIG. 5 shows a flowchart illustrating a method or methods that support techniques to manufacture inter-layer vias in accordance with examples as disclosed herein.

FIG. 5 shows a flowchart illustrating a method 500 that supports techniques to manufacture inter-layer vias in accordance with examples as disclosed herein. The operations of method 500 may be implemented by a process controller or its components as described herein. For example, the operations of method 500 may be performed by a process controller as described with reference to FIGS. 1 through 4. In some examples, a process controller may execute a set of instructions to control the functional elements of the device to perform the described functions. Additionally, or alternatively, the process controller may perform aspects of the described functions using special-purpose hardware.

At 505, the method may include forming an assembly including: a first layer including a first dielectric material; a second layer including a second dielectric material, the second layer above the first layer in a first direction; and a plurality of lines extending in a second direction, each line including a first conductive material and extending through the second layer in the first direction. The operations of 505 may be performed in accordance with examples as disclosed herein. In some examples, aspects of the operations of 505 may be performed by an assembly formation component.

At 510, the method may include forming a third layer including a third dielectric material above the assembly in the first direction. The operations of 510 may be performed in accordance with examples as disclosed herein. In some examples, aspects of the operations of 510 may be performed by a dielectric formation component.

At 515, the method may include forming a cavity extending through the third layer and the second layer in the first direction, the cavity exposing at least a portion of one or more sidewalls of each line of a subset of the plurality of lines. The operations of 515 may be performed in accordance with examples as disclosed herein. In some examples, aspects of the operations of 515 may be performed by a cavity formation component.

At 520, the method may include forming a via including a second conductive material in the cavity, the via in contact with each sidewall of the one or more sidewalls. The operations of 520 may be performed in accordance with examples as disclosed herein. In some examples, aspects of the operations of 520 may be performed by a via formation component.

In some examples, an apparatus as described herein may perform a method or methods, such as the method 500. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for forming an assembly including: a first layer including a first dielectric material; a second layer including a second dielectric material, the second layer above the first layer in a first direction; and a plurality of lines extending in a second direction, each line including a first conductive material and extending through the second layer in the first direction; forming a third layer including a third dielectric material above the assembly in the first direction; forming a cavity extending through the third layer and the second layer in the first direction, the cavity exposing at least a portion of one or more sidewalls of each line of a subset of the plurality of lines; and forming a via including a second conductive material in the cavity, the via in contact with each sidewall of the one or more sidewalls.

Aspect 2: The method, apparatus, or non-transitory computer-readable medium of aspect 1, where the assembly further includes a fourth layer including a fourth dielectric material, the fourth layer above the second layer and each line of the plurality of lines extends through the fourth layer in the first direction.

Aspect 3: The method, apparatus, or non-transitory computer-readable medium of aspect 2, where the fourth dielectric material includes a nitride.

Aspect 4: The method, apparatus, or non-transitory computer-readable medium of any of aspects 1 through 3, further including operations, features, circuitry, logic, means, or instructions, or any combination thereof for forming a fourth layer including a fourth dielectric material above the third layer in the first direction, where forming the cavity is based at least in part on forming the fourth layer.

Aspect 5: The method, apparatus, or non-transitory computer-readable medium of aspect 4, where the fourth dielectric material includes a nitride.

Aspect 6: The method, apparatus, or non-transitory computer-readable medium of any of aspects 1 through 5, where forming the cavity includes operations, features, circuitry, logic, means, or instructions, or any combination thereof for removing a portion of the third layer to expose sidewalls of the third layer and removing a portion of the second layer to expose the one or more sidewalls of each line of the subset of the plurality of lines.

Aspect 7: The method, apparatus, or non-transitory computer-readable medium of any of aspects 1 through 6, where the plurality of lines is arranged in a row extending in a third direction.

Aspect 8: The method, apparatus, or non-transitory computer-readable medium of any of aspects 1 through 7, where each line of the plurality of lines extends at least partially through the first layer in the first direction.

Aspect 9: The method, apparatus, or non-transitory computer-readable medium of any of aspects 1 through 8, where at least one line of the subset of lines is a dummy line.

Aspect 10: The method, apparatus, or non-transitory computer-readable medium of any of aspects 1 through 9, where the first conductive material is a same material as the second conductive material.

Aspect 11: The method, apparatus, or non-transitory computer-readable medium of any of aspects 1 through 10, where the first conductive material includes tungsten.

Aspect 12: The method, apparatus, or non-transitory computer-readable medium of any of aspects 1 through 11, where the first dielectric material is a different material than the second dielectric material.

Aspect 13: The method, apparatus, or non-transitory computer-readable medium of any of aspects 1 through 12, where the second dielectric material and the third dielectric material include an oxide, and the first dielectric material includes a nitride.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 14: ¬An apparatus, including: a first layer including a first dielectric material; a second layer including a second dielectric material, the second layer above the first layer in a first direction; a plurality of lines extending in a second direction, each line including a first conductive material and extending through the second layer in the first direction; a third layer including a third dielectric material above the second layer in the first direction; and a via including a second conductive material and extending through the third layer and the second layer in the first direction, the via in contact with at least a portion of one or more sidewalls of each line of a subset of the plurality of lines.

Aspect 15: The apparatus of aspect 14, further including: a fourth layer including a fourth dielectric material, the fourth layer above the second layer, where each line of the plurality of lines extends through the fourth layer in the first direction.

Aspect 16: The apparatus of any of aspects 14 through 15, further including: a fourth layer including a fourth dielectric material above the third layer in the first direction, where the via extends through the fourth layer in the first direction.

An apparatus is described. The following provides an overview of aspects of the apparatus as described herein:

Aspect 17: ¬An apparatus, including: a first layer including a first dielectric material; a second layer including a second dielectric material, the second layer above the first layer in a first direction; a plurality of lines extending in a second direction, each line including a first conductive material and extending through the second layer in the first direction; a third layer including a third dielectric material above the second layer in the first direction; and a via including a second conductive material and extending through the third layer and the second layer in the first direction, the via in contact with each line of a subset of the plurality of lines, where a bottom surface of the via is at a first position along the first direction and a respective bottom surface of each line of the subset is at a second position along the first direction different than the first position.

Aspect 18: The apparatus of aspect 17, where each line of the plurality of lines extends at least partially through the first layer in the first direction.

Aspect 19: The apparatus of any of aspects 17 through 18, where the first position is above the second position in the first direction.

Aspect 20: The apparatus of any of aspects 17 through 19, where a respective upper surface of each line of the subset is above the bottom surface of the via in the first direction.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current, voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The terms "layer" and "level" used herein refer to an organization (e.g., a stratum, a sheet) of a geometrical structure (e.g., relative to a substrate). Each layer or level may have three dimensions (e.g., height, width, and depth) and may cover at least a portion of a surface. For example, a layer or level may be a three dimensional structure where two dimensions are greater than a third, e.g., a thin-film. Layers or levels may include different elements, components, or materials. In some examples, one layer or level may be composed of two or more sublayers or sublevels.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to provide an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming an assembly comprising:
        a first layer comprising a first dielectric material;
        a second layer comprising a second dielectric material, the second layer above the first layer in a first direction; and
        a plurality of lines extending in a second direction parallel to the first layer, each line comprising a first conductive material and extending through the second layer in the first direction, wherein each line of the plurality of lines extends partially through the first layer in the first direction;
    forming a third layer comprising a third dielectric material above the assembly in the first direction;
    forming a cavity extending through the third layer and the second layer in the first direction, the cavity exposing at least a portion of one or more sidewalls of each line of a subset of the plurality of lines; and
    forming a via comprising a second conductive material in the cavity, the via in contact with each sidewall of the one or more sidewalls, wherein the via extends partially through the first layer in the first direction.

2. The method of claim 1, wherein the assembly further comprises a fourth layer comprising a fourth dielectric material, the fourth layer above the second layer, and wherein each line of the plurality of lines extends through the fourth layer in the first direction.

3. The method of claim 2, wherein the fourth dielectric material comprises a nitride.

4. The method of claim 1, further comprising:
    forming a fourth layer comprising a fourth dielectric material above the third layer in the first direction, wherein forming the cavity is based at least in part on forming the fourth layer.

5. The method of claim 4, wherein the fourth dielectric material comprises a nitride.

6. The method of claim 1, wherein forming the cavity comprises:
    removing a portion of the third layer to expose sidewalls of the third layer; and
    removing a portion of the second layer to expose the one or more sidewalls of each line of the subset of the plurality of lines.

7. The method of claim 1, wherein the plurality of lines is arranged in a row extending in a third direction.

8. The method of claim 1, wherein the first conductive material is a same material as the second conductive material.

9. The method of claim 1, wherein the first dielectric material is a different material than the second dielectric material.

10. The method of claim 1, wherein the second dielectric material and the third dielectric material comprise an oxide, and the first dielectric material comprises a nitride.

11. An apparatus, comprising:
    a first layer comprising a first dielectric material;
    a second layer comprising a second dielectric material, the second layer above the first layer in a first direction;
    a plurality of lines extending in a second direction parallel to the first layer, each line comprising a first conductive material and extending through the second layer and at least partially through the first layer in the first direction;
    a third layer comprising a third dielectric material above the second layer in the first direction; and
    a via comprising a second conductive material and extending through the third layer and the second layer and at least partially through the first layer in the first direction, the via in contact with at least a portion of one or more sidewalls of each line of a subset of the plurality of lines.

12. The apparatus of claim 11, further comprising:
    a fourth layer comprising a fourth dielectric material, the fourth layer above the second layer, wherein each line of the plurality of lines extends through the fourth layer in the first direction.

13. The apparatus of claim 11, further comprising:
    a fourth layer comprising a fourth dielectric material above the third layer in the first direction, wherein the via extends through the fourth layer in the first direction.

14. The apparatus of claim 11, wherein the plurality of lines is arranged in a row extending in a third direction.

15. An apparatus, comprising:
    a first layer comprising a first dielectric material;
    a second layer comprising a second dielectric material, the second layer above the first layer in a first direction;
    a plurality of lines extending in a second direction parallel to the first layer, each line comprising a first conductive material and extending through the second layer and at least partially through the first layer in the first direction;
    a third layer comprising a third dielectric material above the second layer in the first direction; and
    a via comprising a second conductive material and extending through the third layer and the second layer and at least partially through the first layer in the first direction, the via in contact with each line of a subset of the plurality of lines, wherein a bottom surface of the via is at a first position along the first direction and a respective bottom surface of each line of the subset is at a second position along the first direction different than the first position.

16. The apparatus of claim 15, wherein the first position is above the second position in the first direction.

17. The apparatus of claim 15, wherein a respective upper surface of each line of the subset is above the bottom surface of the via in the first direction.

\* \* \* \* \*